United States Patent
Arai et al.

(10) Patent No.: US 6,646,523 B2
(45) Date of Patent: Nov. 11, 2003

(54) DISTRIBUTED CONSTANT TYPE NOISE FILTER

(75) Inventors: Satoshi Arai, Tokyo (JP); Yoshihiko Saiki, Tokyo (JP); Koichiro Masuda, Tokyo (JP)

(73) Assignee: NEC Tokin Corporation (JP)

( * ) Notice: Subject to any disclaimer, the term of this patent is extended or adjusted under 35 U.S.C. 154(b) by 0 days.

(21) Appl. No.: 09/942,280

(22) Filed: Aug. 28, 2001

(65) Prior Publication Data

US 2002/0024407 A1 Feb. 28, 2002

(30) Foreign Application Priority Data

Aug. 30, 2000  (JP) .......................................... 2000-261529

(51) Int. Cl.[7] .............................................. H03H 7/01
(52) U.S. Cl. ......................................... 333/184; 333/185
(58) Field of Search ................................. 333/167, 172, 333/181, 184, 134, 204; 428/209; 361/504, 525, 302

(56) References Cited

U.S. PATENT DOCUMENTS

| | | | | |
|---|---|---|---|---|
| 3,621,342 A | * | 11/1971 | Yoshimura et al. | ......... 361/525 |
| 4,777,460 A | * | 10/1988 | Okubo | ......... 333/167 |
| 4,870,729 A | * | 10/1989 | Ikeda | ......... 29/25.42 |
| 6,285,543 B1 | * | 9/2001 | Komatsu et al. | ............ 361/504 |
| 6,351,368 B1 | * | 2/2002 | Kim | ............ 361/302 |

* cited by examiner

Primary Examiner—Patrick Wamsley
(74) Attorney, Agent, or Firm—Hayes Soloway P.C.

(57) ABSTRACT

In order to accommodate increasing operation speed of a digital circuit, a distributed constant type noise filter having a low impedance transmission line optimal to provide a power de-coupling of an LSI operating at high speed is provided. Particularly, a capacitor-forming portion of the distributed constant type noise filter is constructed with a solid electrolytic capacitor having a 3-terminal structure. In the distributed constant type noise filter constructed as mentioned, a ratio of width W of the capacitor-forming portion to thickness d of a dielectric member thereof and length L of the capacitor-forming portion are set on the basis of dielectric constant of the capacitor-forming portion such that electric noise generated by an electron device connected thereto are removed over a wide frequency range thereof.

14 Claims, 10 Drawing Sheets

DISTRIBUTED CONSTANT TYPE NOISE FILTER

BACKGROUND OF THE INVENTION

1. Field of the Invention

The present invention relates to a distributed constant type noise filter and, particularly, to a distributed constant type noise filter having superior high frequency characteristics in wide frequency band.

2. Description of the Prior Art

The digital technology is important technology that supports the IT (Information Technology) industry. The digital circuit technology for such as LSI, etc., has been utilized recently in not only computers and communication devices but also home electronic devices and car-mounted electronic devices.

However, high frequency current generated in an LSI is not confined in the vicinity of the LSI and is spread widely in a circuit substrate, such as to the printed circuit board on which the LSI is mounted so that high frequency current is inductively coupled to signal wiring and/or grounding wiring on the circuit substrate and leaked out as electromagnetic wave from a signal cable connected thereto, etc.

In a conventional circuit, such as an analog circuit, in which a portion is replaced by a digital circuit or a digital circuit having analog input/output, including an analog circuit and a digital circuit in a mixed state, the electromagnetic interference problem between the digital circuit and the analog circuit is serious.

As a countermeasure for such problem, it is effective to isolate the LSI, which is a source of high frequency current from a power supply system in high frequency range. This method is called "power de-coupling". As a power decoupling element, a noise filter such as a bypass capacitor has been used. Although the operational principle of the power de-coupling is simple, the development of a low impedance noise filter operable correspondingly to the high-speed operation of the digital circuit is substantially delayed. Particularly, the self-resonance phenomenon of the capacitor makes it difficult to keep impedance of the noise filter low in high frequency region.

Therefore, in order to accommodate to the digital circuit whose operation speed and hence operation frequency is increasing, a low impedance noise filter capable of maintaining a power de-coupling in high frequency range has been requested.

The noise filter of the conventional A.C. circuit takes in the form of a lumped constant type noise filter having 2-terminal construction that comprises a solid electrolytic capacitor, an electric double layer capacitor and a ceramic capacitor, mainly.

When the electric noise in the A.C. circuit in wide frequency range is to be removed by means of such capacitors, it has been usual that a plurality of capacitors of different kinds, such as aluminum electrolytic capacitor, tantalum capacitor and ceramic capacitor, whose self resonance frequencies are different, are provided in the A.C. circuit.

However, in the conventional noise filter, it has been troublesome to select a plurality of noise filter elements used for removal of electric noise in wide frequency range.

Furthermore, there has been another problem that the cost of the noise filter is increased due to the provision of the different kinds of noise filter elements.

SUMMARY OF THE INVENTION

An object of the present invention is to provide a noise filter capable of removing a wide frequency range and hence filtering out electric noise in high frequency band, which is generated by electron devices in high frequency range, by using a single noise filter element.

According to the present invention, a distributed constant type noise filter of a 3-terminal system having a transmission line structure is obtained.

That is, according to the present invention, a distributed constant type noise filter having a virtual distributed constant circuit capable of producing impedance, which is continuous in wide frequency range by controlling a width, length and thickness of a capacitor-forming portion thereof, is provided.

In more detail, the distributed constant type noise filter according to the present invention basically includes a capacitor portion constructed with a substantially flat metal plate and a pair of substantially flat dielectric members sandwiching the flat metal plate, a cathode terminal connected to the capacitor-forming portion, electrode portions formed by portions of the metal plate, which protrude from the capacitor-forming portion and anode terminals electrically connected to the electrode portions. It is a feature of the present invention that a length L and a width W of the capacitor-forming portion and an effective thickness h of the dielectric member of the capacitor-forming portion are determined on the basis of dielectric constant of the dielectric member.

As another embodiment of the present invention, the distributed constant type noise filter constructed as mentioned above is featured by that a ratio of the width W of the capacitor-forming portion to the thickness h of the dielectric member thereof and the length L of the capacitor-forming portion are determined on the basis of dielectric constant of the capacitor-forming portion.

With this construction, it is possible to reduce an impedance of the noise filter throughout a wide frequency range. Further, since the impedance on the high frequency side can be reduced, it is possible to provide a distributed constant type noise filter capable of removing electric noise in a wide frequency range, particularly, high frequency range.

As another embodiment of the present invention, the distributed constant type noise filter constructed as mentioned above is featured by that a surface area $S2$ of each anode terminal connected to the electrode portion is larger than a contact area $Si$ of the anode terminal and the electrode portion.

With such construction, it is possible to reduce the impedance of the noise filter compared with the case where $S1$ is equal to $S2$.

In this construction, the distributed constant type noise filter is featured by that width $W2$ of the electrode portion connected to the power source is larger than width $W1$ of the electrode portion connected to the electron device.

In general, impedance of a D.C. power source is low and impedance of a power source terminal of a LSI is high. Therefore, with this construction, impedance on the load side in which a LSI is connected becomes high, so that the impedance matching is achieved. Therefore, it is possible to introduce electric noise to the distributed constant type noise filter of the present invention to thereby easily attenuate the noise.

In the distributed constant type noise filter according to the present invention, at least one recess may be formed in each longer side face of the capacitor-forming portion. In such case, a difference of impedance occurs within the capacitor-forming portion, with which the attenuation of electric noise can be improved.

In the distributed constant type noise filter according to the present invention, the capacitor-forming portion is featured by that one of the width W2 of the electrode portion connected to the power source and the width W1 of the electrode portion connected to the electron device is smaller than the other.

With such construction, it is possible to provide a high impedance region in the capacitor-forming portion to form a π type filter circuit, so that the electric noise attenuation can be improved.

Furthermore, in the distributed constant type noise filter having the recess, the capacitor-forming portion is featured by that the capacitor-forming portion has a configuration having at least one bent portion to form a comb configuration. With such configuration of the capacitor-forming portion, the transmission line length, that is, the long side of the capacitor-forming portion can be increased, so that the electric noise attenuation can be improved.

In the described distributed constant type noise filter according to the present invention, the capacitor-forming portion may be a solid electrolytic capacitor, an electric double layer capacitor or a lamination of two electric double layer cells. With such construction of the capacitor-forming portion, it is possible to improve the breakdown voltage in the capacitor-forming portion.

In the distributed constant type noise filter according to the present invention, lead lines may be connected to the each electrode portion and the cathode terminal. In such case, its impedance is slightly higher, but it is more convenient for mounting.

DETAILED DESCRIPTION OF THE PREFERRED EMBODIMENTS

Figure 1A:
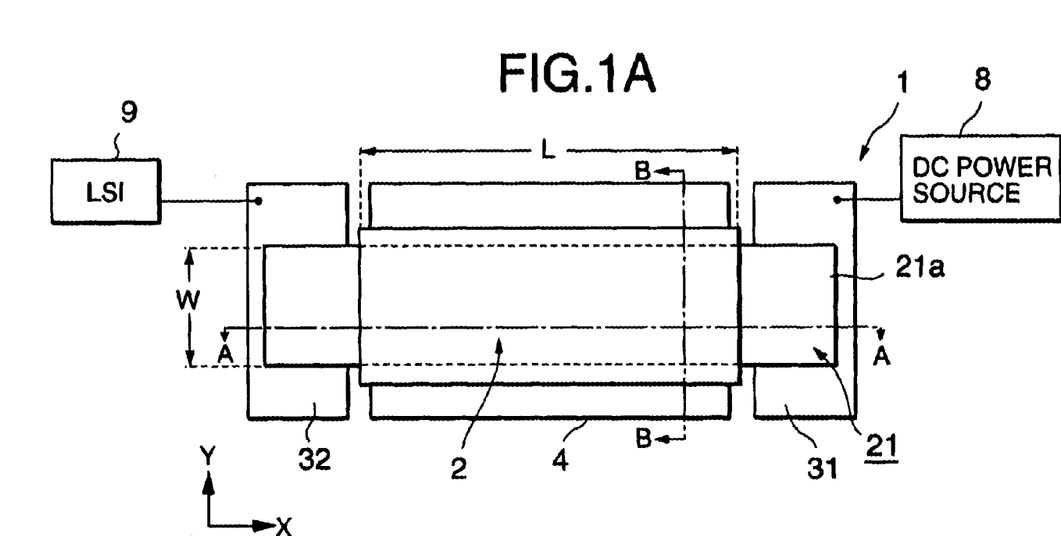
FIG. 1A is a plan view of a distributed constant type noise filter according to a first embodiment of the present invention.
Figure 1B:
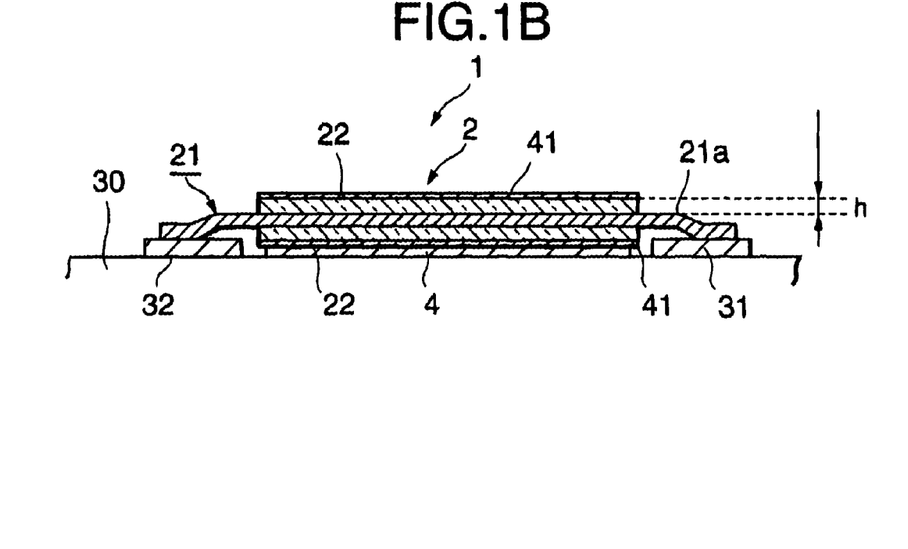
FIG. 1B is a cross section taken along a line A—A in FIG. 1A.
Figure 1C:
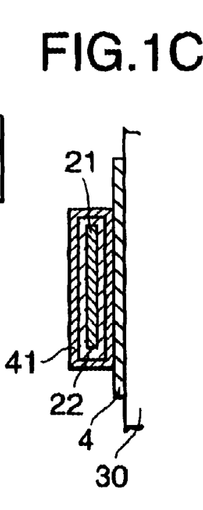
FIG. 1C is a cross section taken along a line B—B in FIG. 1A.

Referring to FIG. 1A to FIG. 1C, a distributed constant type noise filter 1 according to the present invention is constructed as a 3-terminal capacitor having a pair of anode electrode portions 21a protruding in a longer side direction of a rectangular parallelepiped capacitor-forming portion 2 and a cathode electrode portion 4. As shown in FIG. 1B and FIG. 1C, the capacitor-forming portion 2 takes in the form of a transmission line, which is called as a "strip line" and has a flat metal plate 21 sandwiched between two dielectric members 22, which are sandwiched between opposing metal layers 41. Portions of the metal plate 21 protruded from opposite ends of the capacitor-forming portion 2 constitute electrode portions 21a, respectively. The distributed constant noise filter element constructed as mentioned functions as a wide frequency band noise filter when the electrode portions 21a are connected to a power source and a load circuit, respectively, and the opposing metal layers 41 are connected to a fixed potential source such as ground potential, respectively.

The distributed constant type noise filter 1 of the present invention will be described in detail by representing a length of the capacitor-forming portion 2 in the longer side direction (X direction) of the noise filter by L and a length thereof in a shorter side direction, namely, a width of the capacitor-forming portion 2 (Y direction) by W.

The noise filter 1 according to the present invention is mounted on a substrate 30 to which a power source and electron devices are connected. That is, on the mounting substrate 30, the opposite electrode portions 21a of the filter 1 are connected to a power source terminal 31, which is connected to a D.C. power source 8, and a terminal 32, which is connected to an electron device 9 such as LSI, respectively. Further, an electrode terminal 4 for making potentials of the opposing metal layers 41 fixed to such as ground potential is provided on the mounting substrate 30.

Figure 2:
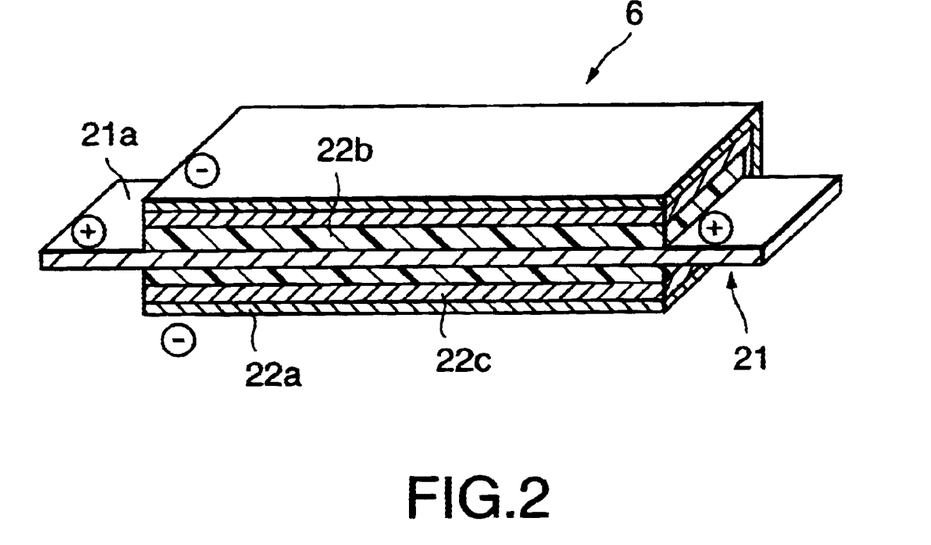
FIG. 2 is a cross-sectional perspective view of a noise filter of the present invention in the form of a 3-terminal solid electrolytic capacitor.

As an example of the noise filter shown in FIG. 1A to FIG. 1C, an aluminum solid electrolytic capacitor 6 such as shown in FIG. 2 will be described. The aluminum solid electrolytic capacitor 6 is constructed with an aluminum foil 21 and oxide films 22b. The surfaces of the aluminum foil 21 are made irregular by etching and the oxide films 22b are formed on the respective irregular surfaces of the aluminum foil 21 as dielectric films. Furthermore, on each of the oxide films 22b, a solid electrolyte layer 22c such as an electrically conductive high molecular layer, and a graphite/silver paste layer 22a are formed as the opposing electrodes. This construction is a strip line similar to the strip line of the noise filter shown in FIG. 1A to FIG. 1C. That is, the line conductor is the center aluminum and the dielectric members correspond to the etching layer having the oxide films. Further, grounding conductor corresponds to the solid electrolytic layer and the graphite/silver paste layer. Since the etching layer is processed such that its surface area is increased, it is possible to obtain an electrostatic capacitance larger than that of a ceramic capacitor, whose size is the same as that of the aluminum solid electrolytic capacitor and which is formed of a single material. Therefore, this capacitor is suitable for use in the distributed constant type noise filter.

A line element manufactured by way of experiment was 10 mm wide, 20 mm long and about 0.15 mm thick. The thickness corresponds to the thickness of the dielectric member. Further, electrostatic capacitance of the whole line was 330 $\mu$F (rated voltage of 4V). The characteristic impedance of this line element calculated according to an equation to be described later was 0.5 m$\Omega$.

Figure 3:
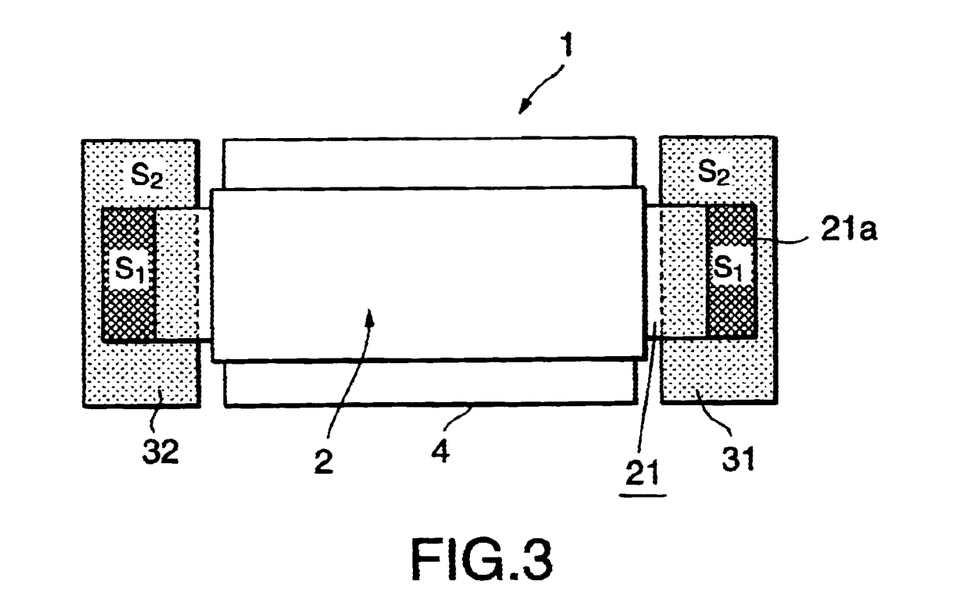
FIG. 3 is a plan view of a preferable electrode portion of the distributed constant type noise filter shown in FIG. 1A.

As mentioned previously, the electrode portions $21a$ are connected to the power source terminal 31 and the device terminal 32, respectively. In this case, it is preferable to set a surface area S2 of each of the power source terminal 31 and the devices terminal 32 larger than a surface area S1 of each of a connecting region of the electrode portion $21a$ and the power source terminal 31 and a connecting region of the electrode portion $21a$ and the devices terminal 32. A first one of purposes for setting the surface areas S2 as mentioned above is to reduce the contact resistance by increasing the contact areas S2 as much as possible. When the contact resistances are large, there is a loss of D.C. component, so that heat is generated. On the other hand, the second purpose is to solve a problem that, when the areas of the power source terminal 31 and the devices terminal 32 are small, impedance of these terminals become high and high frequency current, which is a noise component, is hardly introduced to the metal plate 21.

Now, a design of the distributed constant type noise filter of the present invention, which can remove high frequency electrical noise in a wide frequency range, will be described.

Figure 4A:
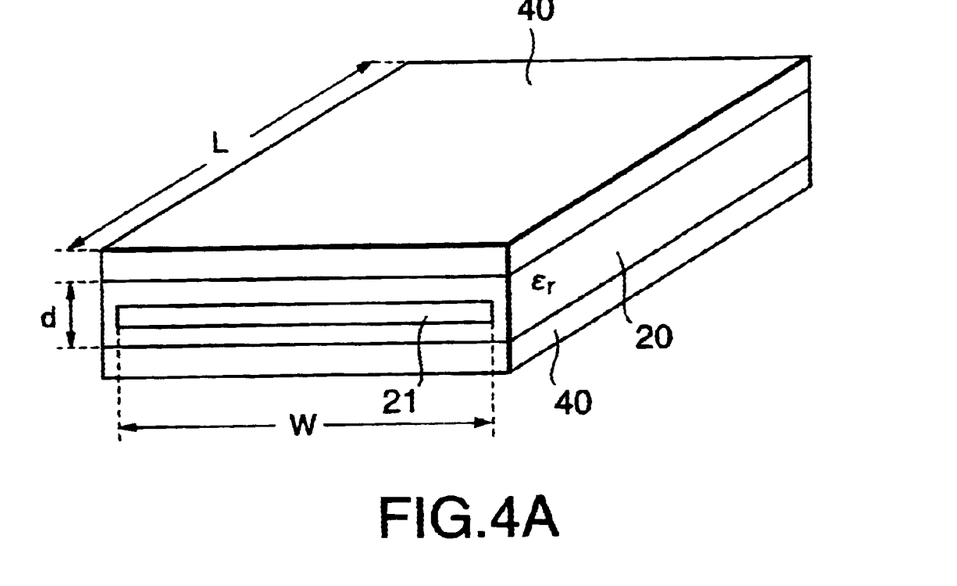
FIG. 4A is a perspective view of a capacitor-forming portion of the distributed constant type noise filter according to the first embodiment of the present invention.

In a transmission line model having a structure including a dielectric member 20 and a pair of metal plates 40 sandwiching the dielectric member 20, shown in FIG. 4A, capacitance C and inductance L of a unit length of the transmission line can be represented by $$C=4\epsilon_o\epsilon_r W/d$$

$$L=(\tfrac{1}{4})\mu_o d/W$$

where $\epsilon_o$ is dielectric constant of vacuum, $\epsilon_r$ is specific dielectric constant of the dielectric member, d is thickness of the dielectric member and $\mu_o$ is magnetic permeability of vacuum.

Accordingly, characteristic impedance $Z_0$ of the transmission line model becomes $$Z_0 = (L/C)^{1/2}$$
$$= (1/4)(d/W)(\mu_o/\varepsilon_0\varepsilon_r)^{1/2}$$

In the following, the capacitor-forming portion of transmission line is made of such capacitors as aluminum solid electrolytic capacitor, electric double layer capacitor and ceramic capacitor, respectively.

As for the aluminum solid electrolytic capacitor, its capacitor-forming portion is made by forming oxide film on the enlarged etched surface of the aluminum. In the electric double layer capacitor, its capacitor-forming portion is produced at an interface between activated carbon electrode surface and electrolyte. Since these capacitor-forming portions have complicated configuration, equivalent specific dielectric constant is defined from capacity per a unit length and effective thickness to make it easy for analyzing its characteristics.

Representing the electrostatic capacitance per unit length by C, effective thickness of the capacitor-forming portion by h and an equivalent specific dielectric constant by $\epsilon_u$, $$C=4\epsilon_o\epsilon_u W/h$$

that is, $$\epsilon_u=1/(4\epsilon_o)\cdot Ch/W$$

where $\epsilon_o=8.85\times10^{-12}$ F/m.

In a case of a general aluminum solid electrolytic capacitor mentioned above, electrostatic capacitance per unit length is $C=1.65\times10^{-12}$ (F/m) and effective thickness (h) and width (W) of a capacitor-forming portion (an etching layer on which an oxide film is formed) are $h=4=10^{-4}$(m), $W=1.0\times10^{-2}$ (m). Therefore, equivalent specific dielectric constant $\epsilon_u=7.0\times10^6$.

Similarly, in a case of a general electric double layer capacitor, electrostatic capacitance per unit area is $C=3.54\times10^1$ (F/m) and effective thickness (h) and width (W) of a capacitor-forming portion (portion sandwiched between an upper and lower collectors) are $h=1.0\times10^{-4}$ (m), $W=1.0\times10^{-2}$ (m). Therefore, equivalent specific dielectric constants, $\epsilon_u=1.0\times10^{10}$.

On the other hand, in a case of a ceramic capacitor having a capacitor-forming portion formed of a uniform ceramic material, equivalent specific dielectric constant thereof is specific dielectric constant of the ceramic material. Therefore, equivalent specific dielectric constant is about $8.0\times10^3$.

In the above-mentioned equation of the characteristic impedance, when equivalent specific dielectric constant $\epsilon_u$ of the respective capacitors is used for the specific dielectric constant $\epsilon_r$ of the dielectric member while effective thickness h is used for thickness d, its characteristic impedance becomes as follow:

$$Z_0=(\tfrac{1}{4})(h/W)(\mu_0/\epsilon_0\epsilon_u)^{1/2}$$

In order to remove electric noise sufficiently, it is desired to make the characteristic impedance to be 0.1 $\Omega$ or less. Accordingly, the condition to make that characteristic impedance to be 0.1 $\Omega$ or less is expressed by following equation:

$$W/h>2.5(\mu_0/\epsilon_0\epsilon_u)^{1/2}$$

By using $\epsilon_o=8.85\times10^{-12}$ F/m, $\mu_o=1.26\times10^{-6}$(H/m) and equivalent specific dielectric constant $\epsilon_u$ of the respective capacitors, the result of the calculations is as follows:

Aluminum solid electrolytic capacitor: W/h>0.36

Electric double layer capacitor: W/h>0.009

Ceramic capacitor: W/h>11

Furthermore, the wavelength at the capacitor-forming portion is calculated by following equation by taking the reduction of wavelength due to dielectric member into consideration:

$$\lambda=c/f\epsilon_r^{1/2}$$

where, $\lambda$ is a wavelength (m); c is light velocity ($3.0\times10^8$ m/s); and f is frequency (Hz).

When a range of frequency f in which the noise restriction is generally required is set to 30 MHz to 1 GHz, the longest wavelength λ corresponding to frequency of 30 MHz is 3.8 mm for the aluminum electrolytic capacitor, 0.1 mm for the electric double layer capacitor and 112 mm for the ceramic capacitor, respectively.

In order to attenuate noise sufficiently, it is preferable that the length L of the longer side of the noise filter is set to a value equal to or more than ¼wavelength. Therefore, it is possible to obtain a distributed constant type noise filter capable of removing electric noise in wide frequency range by setting L to a value larger than 0.95 mm when an aluminum solid electrolytic capacitor is used in the capacitor-forming portion, to a value larger than 0.025 mm when an electric double layer capacitor is used therein or to a value larger 28 mm when a ceramic capacitor is used therein.

Figure 4B:
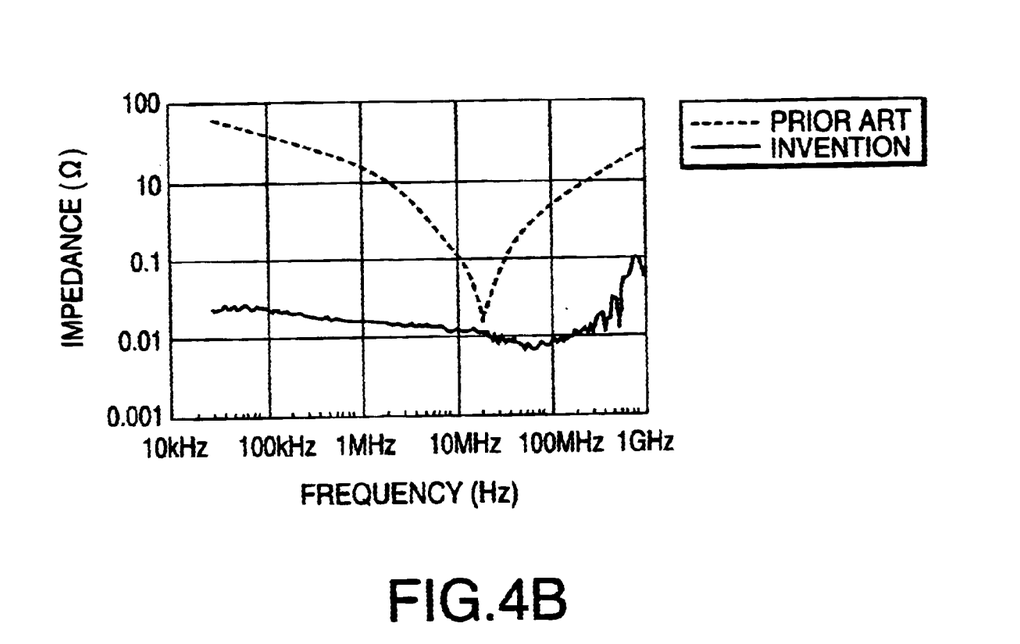
FIG. 4B is a graph showing frequency characteristics of the distributed constant noise filter shown in FIG. 4A in comparison with frequency characteristics of a conventional noise filter.

FIG. 4B shows a graph showing a relation between frequency and impedance in the distributed constant type noise filter according to the present invention.

A relation between frequency and impedance when a conventional noise filter, which is a laminated ceramic chip capacitor of 0.1 μF, is used in the capacitor-forming portion is also shown in FIG. 4B for comparison purpose.

Incidentally, the frequency-impedance relations shown in FIG. 4B were obtained by arranging the distributed constant type noise filter according to the present invention and the conventional noise filter on respective mounting substrates, connecting them to network analyzers, respectively, and measuring S parameters thereof to calculate impedance of them.

As will be clear from FIG. 4B, impedance of the distributed constant type noise filter according to the present invention is small over a wide range from low frequency to high frequency, compared with the conventional noise filter.

Furthermore, impedance of the distributed constant type noise filter of the present invention is stable over the wide frequency range and is not substantially reduced at high frequency around 10 MHz unlike the conventional noise filter. Therefore, according to the present invention, it is possible to obtain a noise filter, which is stable over a wide frequency range, compared with the conventional filter.

Now, a first embodiment of the distributed constant type noise filter according to the present invention will be described with reference to FIGS. 1A to 1C.

In the distributed constant type noise filter according to the present invention, the D.C. power source 8 is indirectly connected to one of the electrode portions 21a through one of the anode terminals 3 and the electron device 9 such as LSI is indirectly connected to the other electrode portion 21a through the other anode electrode 3.

Next, a construction of the distributed constant type noise filter according to a second embodiment of the present invention will be described with reference to FIG. 5.

Description of portions of the second embodiment, which are similar to those of the first embodiment, is omitted.

Figure 5:
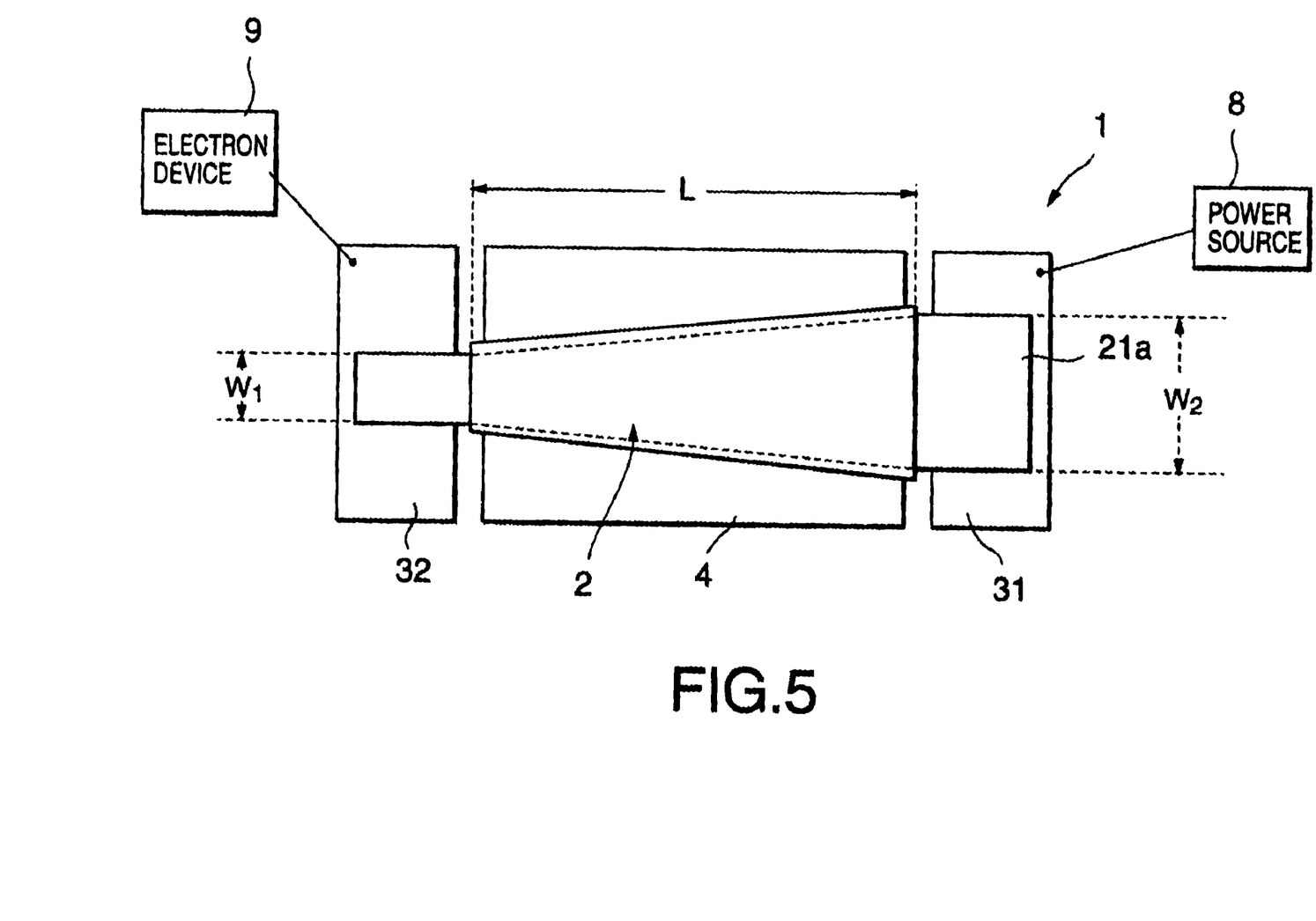
FIG. 5 is a plan view of a distributed constant type noise filter according to a second embodiment of the present invention.

FIG. 5 is a plan view of the distributed constant type noise filter according to the second embodiment.

As shown in FIG. 5, opposite short sides of the capacitor-forming portion 2 have different widths.

That is, the D.C. power source 8 is indirectly connected to one of the electrode portions 21a having larger width W2 through one of the anode terminals 3, which protrudes from the wider side of the capacitor-forming portion 2.

The electron device 9 such as LSI is indirectly connected to the other electrode portion 21a having smaller width W1 through the other anode electrode 3, which protrudes therefrom.

Next, a construction of the distributed constant type noise filter according to a third embodiment of the present invention will be described with reference to FIG. 6.

Description of portions of the second embodiment, which are similar to those of the first and second embodiments, is omitted.

Figure 6:
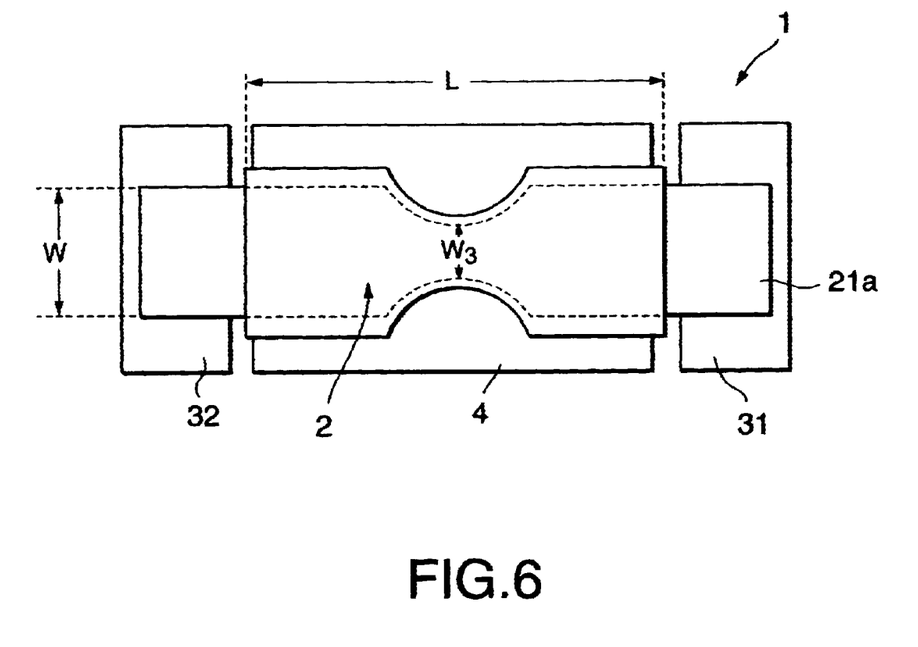
FIG. 6 is a plan view of a distributed constant type noise filter according to a third embodiment of the present invention.

FIG. 6 is a plan view of the distributed constant type noise filter according to the third embodiment.

As shown in FIG. 6, the capacitor-forming portion 2 of the distributed constant type noise filter according to the third embodiment has a constricted center portion.

In more detail, at least one recess is provided in each of the longer sides of the capacitor-forming portion 2 to form a portion having width W3, which satisfies W>W3 where W is width of the short side of the capacitor-forming portion 2, in the center portion of the capacitor-forming portion 2.

Width of one of the short sides may be equal to that of the other. Alternatively, the width of one of the short sides may be different from that of the other, provided that W3 is smaller than the smaller width of the short side.

Figure 7:
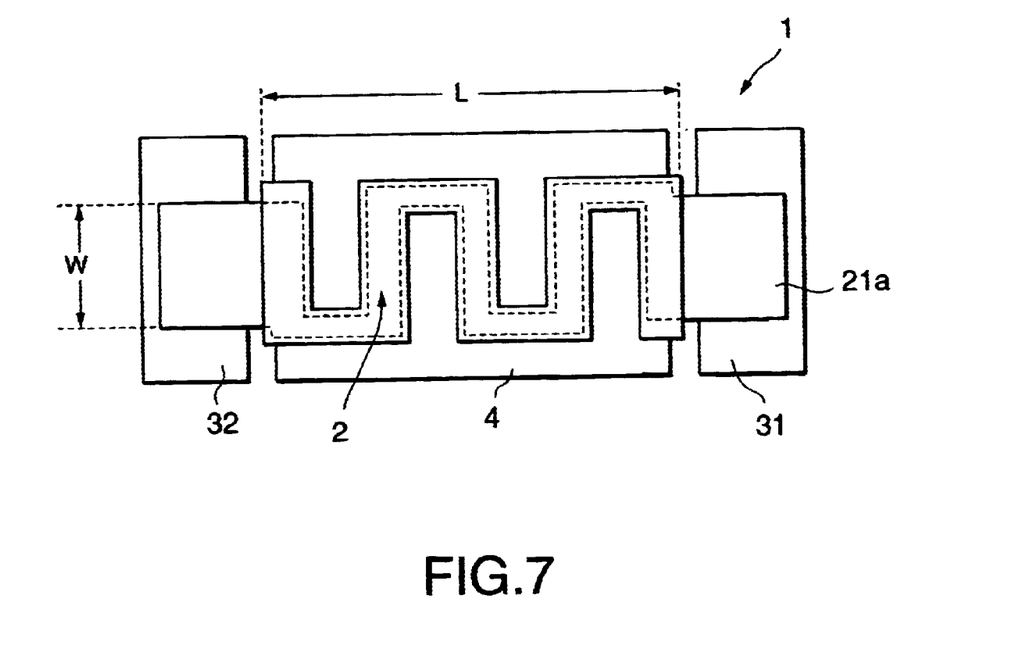
FIG. 7 is a plan view of a distributed constant type noise filter according to a fourth embodiment of the present invention.

Next, a construction of the distributed constant type noise filter according to a fourth embodiment of the present invention will be described with reference to FIG.

Description of portions of the second embodiment, which are similar to those of the first to third embodiments, is omitted.

FIG. 7 is a plan view of the distributed constant type noise filter according to the fourth embodiment.

As shown in FIG. 7, the capacitor-forming portion 2 of the distributed constant type noise filter according to the fourth embodiment has a comb configuration formed by providing at least two recesses in each of the longer sides of the capacitor-forming portion 2.

With the capacitor-forming portion 2 having such comb configuration, the line length of the capacitor-forming portion 2 is increased, so that it is possible to filter out electric noise having frequency over a wide frequency range.

Figure 8:
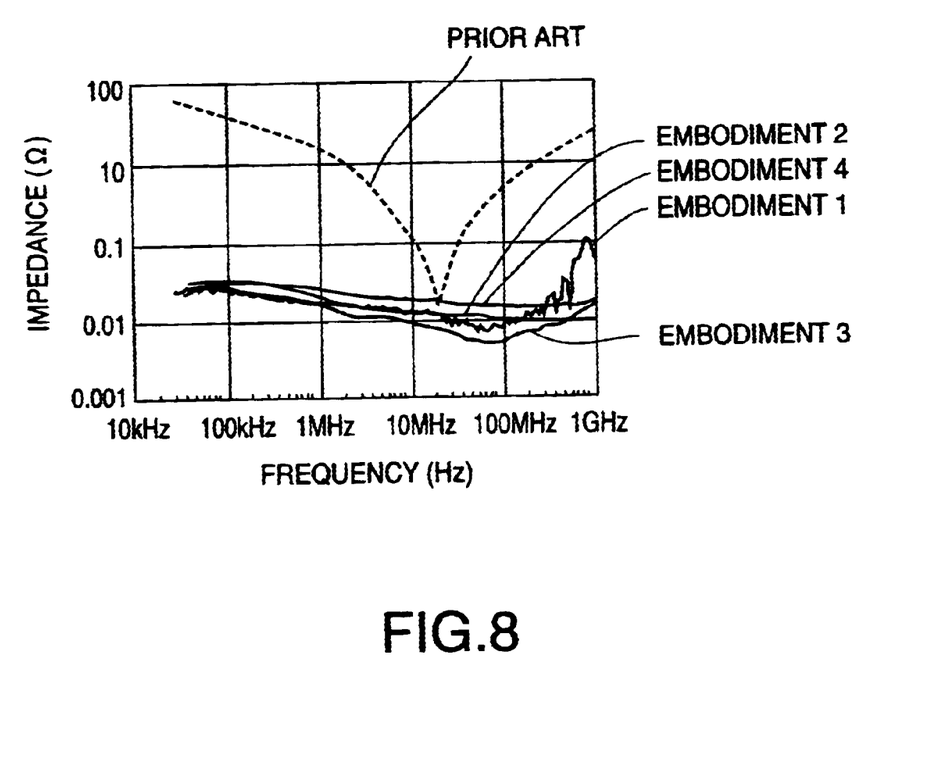
FIG. 8 is a graph showing frequency characteristics of the distributed constant noise filters according to the first to fourth embodiments of the present invention in comparison with frequency characteristics of a conventional noise filter.

Characteristic curves in FIG. 8 show the relations between frequency and impedance of the distributed constant type noise filters according to the first to fourth embodiments of the present invention.

In FIG. 8, the relation between frequency and impedance of the conventional noise filter in the form of a chip capacitor of 0.1 μF is also shown for comparison purpose.

Incidentally, the frequency-impedance relations shown in FIG. 8 were obtained by arranging the distributed constant type noise filters according to the present and the conventional noise filter on respective mounting substrates, connecting them to respective network analyzers and measuring S parameters thereof to calculate impedance of them.

As will be clear from FIG. 8, impedance of each of the distributed constant type noise filters according to the present invention is small over a wide range from low frequency to high frequency, compared with the conventional noise filter.

Furthermore, since impedance of each of the distributed constant type noise filters of the present invention is relatively stable over the wide frequency range and is not changed substantially at high frequency around 10 MHz unlike the conventional noise filter, it is possible according to the present invention to obtain a noise filter having stable frequency characteristics over a wide frequency range.

Particularly, since impedance of each of the distributed constant type noise filters according to the first to fourth embodiments of the present invention is low in high frequency side, compared with the conventional noise filter, it is possible to attain a removal of high frequency electric noise, which is increased with improvement of LSI technology.

As mentioned previously, the solid electrolytic capacitor can be employed in the capacitor-forming portion of the distributed constant type noise filter of each of the first to fourth embodiments of the present invention.

Now, a fifth embodiment of the present invention, which employs the electric double layer capacitor in the capacitor-forming portion thereof, will be described with reference to FIG. 9A, which is a side view of the distributed constant type noise filter according to the fifth embodiment, and FIG. 9B, which is a cross-sectional perspective view of the distributed constant type noise filter shown in FIG. 9A.

Incidentally, description of portions of the fifth embodiment, which are similar to those of the first to fourth embodiments, is omitted.

Figure 9A:
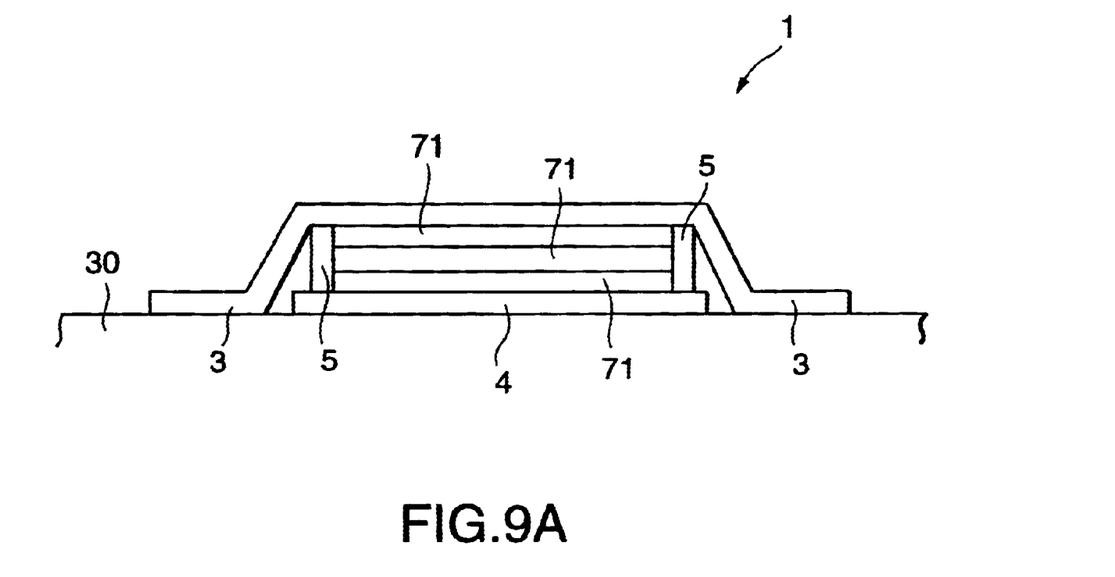
FIG. 9A is a cross section of a distributed constant type noise filter according to a fifth embodiment of the present invention.

As shown in FIG. 9A, the capacitor-forming portion 2 of the distributed constant type noise filter according to the fifth embodiment employs the electric double layer capacitor. By forming the capacitor-forming portion 2 with a plurality of electric double layer cells, it is possible to make the breakdown voltage of the noise filter high.

Figure 9B:
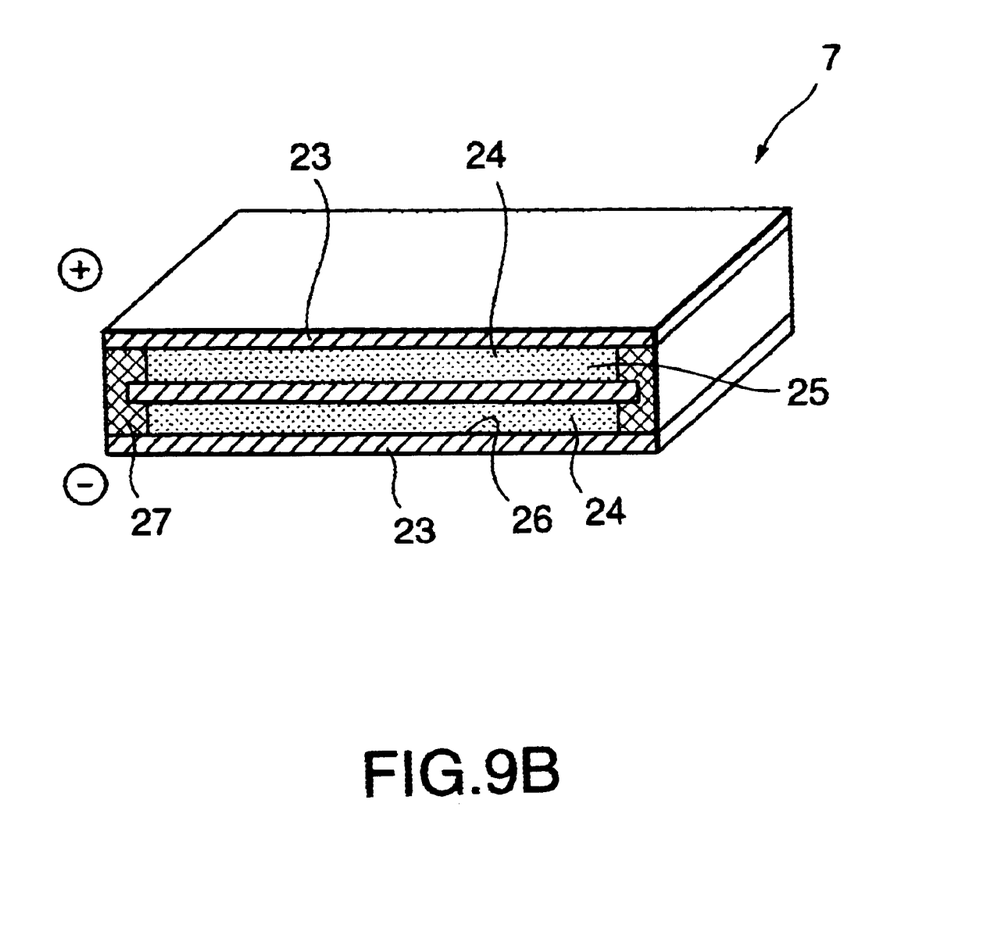
FIG. 9B is a cross-sectional perspective view showing a unit cell of an electric double layer capacitor shown in FIG. 9A.

Furthermore, as shown in FIG. 9B, each electric double layer cell 7 is constructed such that collectors 23 arranged above and below gaskets 27 form an anode and a cathode, respectively, and carbon electrodes 24 electrically connected to the respective collectors 23 and electrolyte 25 sandwich a separator 26, which permeates electrolyte.

As described hereinbefore, according to the distributed constant noise filter of the present invention, it is possible to efficiently remove high frequency noise over a wide frequency range without necessity of providing a plurality of noise filters having different self-resonance vibration.

Figure 10A:
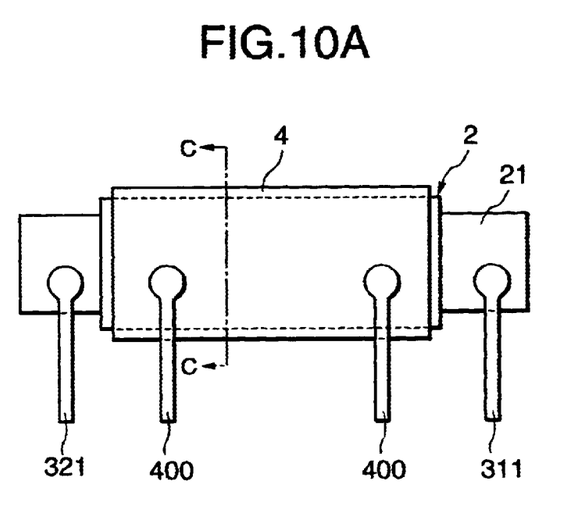
FIG. 10A is a plan view of a distributed constant type noise filter according to a sixth embodiment of the present invention.
Figure 10B:
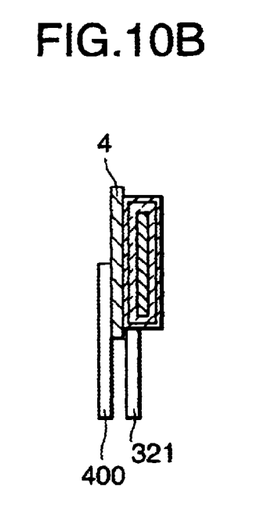
FIG. 10B is a cross section taken along a line C—C in FIG. 10A.

FIG. 10A is a plan view of the distributed constant type noise filter according to the sixth embodiment. As shown in FIG. 10A, the lead lines 311, 321 are connected to electrode portions 21a. And lead lines 400 are connected to an electrode terminal 4. In such case, its impedance is slightly higher, but it is more convenient for mounting.

That is, according to the distributed constant type noise filter of the present invention, the manufacturing cost can be reduced since the troublesome works for setting a frequency range of a capacitor arranged in an A.C. circuit in the capacitor for noise removal is unnecessary.

What is claimed is:

1. A distributed constant type noise filter comprising:
   a first electrically conductive member having a first rectangular electrode portion and a second rectangular electrode portion provided in opposite ends thereof, said first rectangular electrode portion being connected to a power source and said second rectangular electrode portion being connected to an electron device;
   a second electrically conductive member provided in an opposing relation to said first electrically conductive member and connected to a fixed potential source; and
   a capacitor-forming portion formed in a region in which said first and second electrically conductive members are arranged in the opposing relation to each other, width and length of said capacitor-forming portion and thickness of a dielectric member of said capacitor-forming portion being set such that said capacitor-forming portion forms a transmission line structure.

2. A distributed constant type noise filter as claimed in claim 1, wherein the width of said first rectangular electrode portion is larger than the width of said second rectangular electrode portion.

3. A distributed constant type noise filter as claimed in claim 2, wherein one of the width of said first rectangular electrode portion and the width of said second rectangular electrode portion is smaller than the other.

4. A distributed constant type noise filter as claimed in claim 1, wherein said capacitor-forming portion comprises a solid electrolytic capacitor.

5. A distributed constant type noise filter as claimed in claim 4, wherein said solid electrolytic capacitor is an aluminum solid electrolytic capacitor and the ratio of the width of said capacitor-forming portion to the thickness of said dielectric member thereof is larger than 0.36.

6. A distributed constant type noise filter as claimed in claim 1, wherein said capacitor-forming portion comprises an electric double layer capacitor.

7. A distributed constant type noise filter as claimed in claim 6, wherein the ratio of the width of said capacitor-forming portion to the thickness of said dielectric member of said capacitor-forming portion is larger than 0.009.

8. A distributed constant type noise filter as claimed in claim 1, wherein the length of said capacitor-forming portion is equal to or larger than ¼ wavelength of high frequency generated by said electron device.

9. A distributed constant type noise filter as claimed in claim 1, wherein a ratio of the width of said capacitor-forming portion to the thickness of said dielectric member thereof is set such that characteristic impedance of the transmission line model of said distributed constant type noise filter becomes equal to 0.1 Ω or less.

10. A distributed constant type noise filter as claimed in claim 1, further comprising anode terminals connected to said first and second rectangular electrode portions, respectively, wherein a surface area of each said anode terminal is larger than a contact area of said anode terminal and said rectangular electrode portion.

11. A distributed constant type noise filter as claimed in claim 1, wherein at least one recess is formed in each longer side face of said capacitor-forming portion.

12. A distributed constant type noise filter as claimed in claim 1, wherein said capacitor-forming portion has a having at least one bent portion.

13. A distributed constant type noise filter as claimed in claim 1, further comprising lead lines respectively connected to each of said electrode portions.

14. A distributed constant type noise filter as claimed in claim 1, wherein the ratio of the width of said capacitor-forming portion to the thickness of said dielectric member of said capacitor-forming portion is larger than 0.009.

* * * * *

UNITED STATES PATENT AND TRADEMARK OFFICE
CERTIFICATE OF CORRECTION

PATENT NO. : 6,646,523 B2  
DATED : November 11, 2003  
INVENTOR(S) : Arai et al.

It is certified that error appears in the above-identified patent and that said Letters Patent is hereby corrected as shown below:

<u>Column 10,</u>  
Line 47, "has a having" should be -- has a configuration having --.

Signed and Sealed this

Twenty-third Day of March, 2004

JON W. DUDAS  
*Acting Director of the United States Patent and Trademark Office*